United States Patent

Kim et al.

Patent Number: 6,117,765
Date of Patent: Sep. 12, 2000

[54] METHOD OF PREVENTING CRACKS IN INSULATING SPACES BETWEEN METAL WIRING PATTERNS

[75] Inventors: Han Seong Kim, Suwon; Young Soo Jeon, Anyang; Ho Sik Kim; Gi Ho Seo, both of Suwon, all of Rep. of Korea

[73] Assignee: Samsung Electronics Co., Ltd., Suwon, Rep. of Korea

[21] Appl. No.: 09/391,616

[22] Filed: Sep. 7, 1999

Related U.S. Application Data

[62] Division of application No. 09/137,934, Aug. 21, 1998, Pat. No. 5,998,872.

[30] Foreign Application Priority Data

Jan. 7, 1998 [KR] Rep. of Korea .......................... 98-193

[51] Int. Cl.[7] .......................... H01L 23/58; H01L 23/48; H01L 23/52; H01L 21/44; H01L 21/4763

[52] U.S. Cl. .......................... 438/624; 438/669; 438/618; 438/652; 438/598; 438/597; 438/622; 257/773; 257/758; 257/633

[58] Field of Search ...................... 438/622, 624, 438/667, 618, 666, 687, 688, 623, 669, 625, 637, 639, 597, 958, 598; 257/633, 637, 758, 773

[56] References Cited

U.S. PATENT DOCUMENTS

5,760,429   6/1998   Yano et al. .............................. 257/211

Primary Examiner—Charles Bowers
Assistant Examiner—Thanhha Pham
Attorney, Agent, or Firm—Jones Volentine, L.L.P.

[57] ABSTRACT

A semiconductor device having a metal layer pattern which prevents cracks from forming in insulating spaces. The semiconductor device includes a plurality of metal layers stacked vertically and a plurality of insulating layers, interposed vertically between the plurality of metal layers. A metal wiring pattern is formed on each of the plurality of metal layers. The wiring patterns are separated by insulating spaces, and the insulating spaces in each of the plurality of metal layers are vertically shifted with regard to the neighboring one of the plurality of metal layers.

4 Claims, 4 Drawing Sheets

METHOD OF PREVENTING CRACKS IN INSULATING SPACES BETWEEN METAL WIRING PATTERNS

This application is a division of application Ser. No. 09/137,934 filed Aug. 21, 1998 now U.S. Pat. No. 5,998,872.

BACKGROUND OF THE INVENTION

1. Field of the Invention

The present invention relates to a semiconductor device and a method for fabricating thereof. Particularly, this invention relates to a semiconductor device having a plurality of metal layers with wiring patterns positioned for avoiding cracks at insulating spaces.

2. Description of the Related Art

As part of the recent trend toward larger scale integration of semiconductor devices, the devices have evolved from having a conventional single or dual metal layer structure to having a multilevel metal layer structure. Chemical vapor deposition (CVD) is widely used to form an insulating layer between every pair of metal layers and between portions of a wiring pattern formed in the metal layer.

The advantages of CVD include a high deposition rate and easy control over deposition thickness. However, a CVD film has a relatively low strength. That is to say, a CVD film deposited on a metal layer may crack, depending on the thermal state and pattern of metal in the metal layers. Cracks generally occur due to unbalanced stress from differences in thermal expansion between the metal in a metal layer and the CVD film in insulating layers between the metal layers and in insulating spaces within each metal layer. In a multilevel metal layer device, especially in a metal layer having a wiring pattern with widths of 30 micrometers ($\mu$m) or more, the probability of cracking is higher than in devices with fewer metal layers and narrower wiring patterns. This greater probability of cracking arises because vertical expansion is greater over several stacked metal wiring patterns than over fewer stacked metal wiring patterns and horizontal expansion is greater for wide patterns than for narrow patterns. In these circumstances the stresses due to difference in thermal expansion between the metal and the insulating CVD material is increased, and as more stresses accumulate the more cracks that occur.

FIGS. 1A and 1B show a crack occurring in a semiconductor device having multilevel metal layers. As shown in FIG. 1A, horizontally oriented metal layers 111, 112 and 113 are separated vertically by interposed insulating layers 116, 117, and 118. Within a given metal layer, e.g., 112, one or more metal wiring patterns, e.g., 115 and 115', are separated by one or more insulating spaces 212 according to a wiring pattern design. The insulating spaces 212, 213 have width d1. FIG. 1A shows a vertical crack 110 which occurs through the spaces 213, 212 between metal wiring patterns 114 and 114', and 115 and 115', respectively. The crack 110 crosses the interposed insulating layers 118, 117 and 116 vertically separating the metal layers 113, 112 and 111.

FIG. 1B shows the horizontal aspect of a crack 120. The horizontal crack 120 occurs in an insulating space 203 between parallel metal wiring patterns of one metal layer 103 where the width of the wiring pattern is greater than the width d1' of the insulating space 203. Specifically, FIG. 1B shows that, in metal layer 103 where wide metal wiring patterns are juxtaposed to narrow insulating spaces 203, a crack 120 longitudinally occurs at a space between the metal wiring patterns. The crack has both a horizontal aspect occurring in an insulating space 203 between the parallel metal wiring patterns of one metal layer 103 and a vertical aspect occurring through the insulating spaces 203, 202 and 201 of each metal layer 103, 102 and 101 and through the interposed insulating layers.

Referring again to FIG. 1A, it is noted that the vertical aspect of the crack 110 occurs because the vertical column of pure CVD material in the spaces 212 and 213 expands much differently than other columns of alternating metal and CVD layers. Therefore vertical tensile stresses at the vertical column through the edges of the wiring patterns 115 and 114 in each metal layer are accumulated until those stresses exceed the strength of the CVD film, and the CVD film cracks. Since metal is more malleable than the CVD material, the metal may deform but it does not crack at such stresses.

A typical semiconductor device manufacturing process includes many steps carried out at a temperature of 400° C. or more, followed by other steps closer to room temperature. The metal layers are thermally expanded during the high temperature processes, and contracted when exposed to a room temperature. Thermal expansion is proportional to size and is typically greater for metals than for CVD materials. Accordingly, in the structure shown in FIG. 1A, in which the insulating spaces 213 and 212 are stacked one above another, the thick column of CVD material expands/contracts only a little, while the columns with metal wiring patterns in the metal layers expands/contracts more. This introduces an accumulated stress that can exceed the strength of the CVD material for certain temperature changes. Especially when the insulating spaces 213, 212 between wiring patterns 114, 114', 115, 115' have a size d1 less than 4 $\mu$m, the horizontal thermal expansion difference between the metal wiring pattern and the CVD film adds to the total stress and increases the probability of cracking.

The horizontal crack 120 in FIG. 1B occurs when the horizontal thermal expansion of the metal wiring pattern is far greater than that of a CVD film, which is typically an oxide. When the CVD material in the insulating spaces 203, 202, 201 cannot withstand the expansion/contraction cycle of the metal wiring patterns any longer, the CVD film finally cracks at a narrow insulating space 203 of size $d_1$. Since a CVD film is deposited on the expanded metal at high temperature above 400° C. and is later exposed to room temperature, the stresses are applied at the interface between the metal wiring pattern and the CVD film. As in the vertical crack, the metal in the metal layer 101, 102, 103 is a soft material, i.e., it is malleable, at room temperatures so it does not crack easily; while the CVD film is a hard material so that it cracks first. This phenomenon becomes greater if the metal wiring pattern includes some with lengths and widths greater than the device size. (The width of the metal wiring pattern is typically below 30 $\mu$m.) The larger wiring patterns expand/contract more than the smaller wiring patterns, adding to the stresses on the CVD film at some locations of the wiring pattern.

If a crack 110, 120 occurs, electrons can leak out along the crack 110, 120 opening and subsequent metal layers, e.g., 103, may fill the crack and connect to other layers, e.g., 102, thus bridging the metal layers and causing an electrical short, so that the insulation efficacy of the device's insulating layers is deteriorated and may cause the device to be defective. A very severe defect is especially likely because, in a multilevel metal layer device, a tungsten layer typically is deposited on the full area of the device to interconnect contacts, so a crack is likely to lead to a short.

Accordingly, a semiconductor device design is needed that prevents insulating spaces from cracking, especially for a multilevel metal layer structure for which the probability of cracking is greater than for a single or dual metal layer structure.

SUMMARY OF THE INVENTION

It is an object of the present invention to provide a semiconductor device having a metal layer wiring pattern suitable for preventingا CVD film of an insulating layer from cracking.

It is an another object of the present invention to provide a method for preventing a CVD film of an insulating layer from cracking.

To achieve the first object as well as other advantages and objects of the present invention, a semiconductor device includes a plurality of metal layers stacked vertically and a plurality of insulating layers, interposed vertically among the plurality of metal layers. Metal wiring patterns are disposed in each of the plurality of metal layers and are separated horizontally by a plurality of spaces. The plurality of spaces in each of the plurality of metal layers are horizontally positioned apart from the plurality of spaces in a respective neighboring one of the plurality of metal layers.

In another aspect, a method of fabricating semiconductor devices that avoids cracking includes vertically interposing a plurality of horizontal insulating layers among a plurality of horizontal metal layers. A plurality of spaces are disposed between wiring patterns in each of the plurality of metal layers horizontally apart from a plurality of other spaces between other wires in a respective neighboring metal layer.

BRIEF DESCRIPTION OF THE DRAWINGS

The present invention is described with reference to the drawings, in which.

DETAILED DESCRIPTION OF THE PREFERRED EMBODIMENT

Figure 1A:
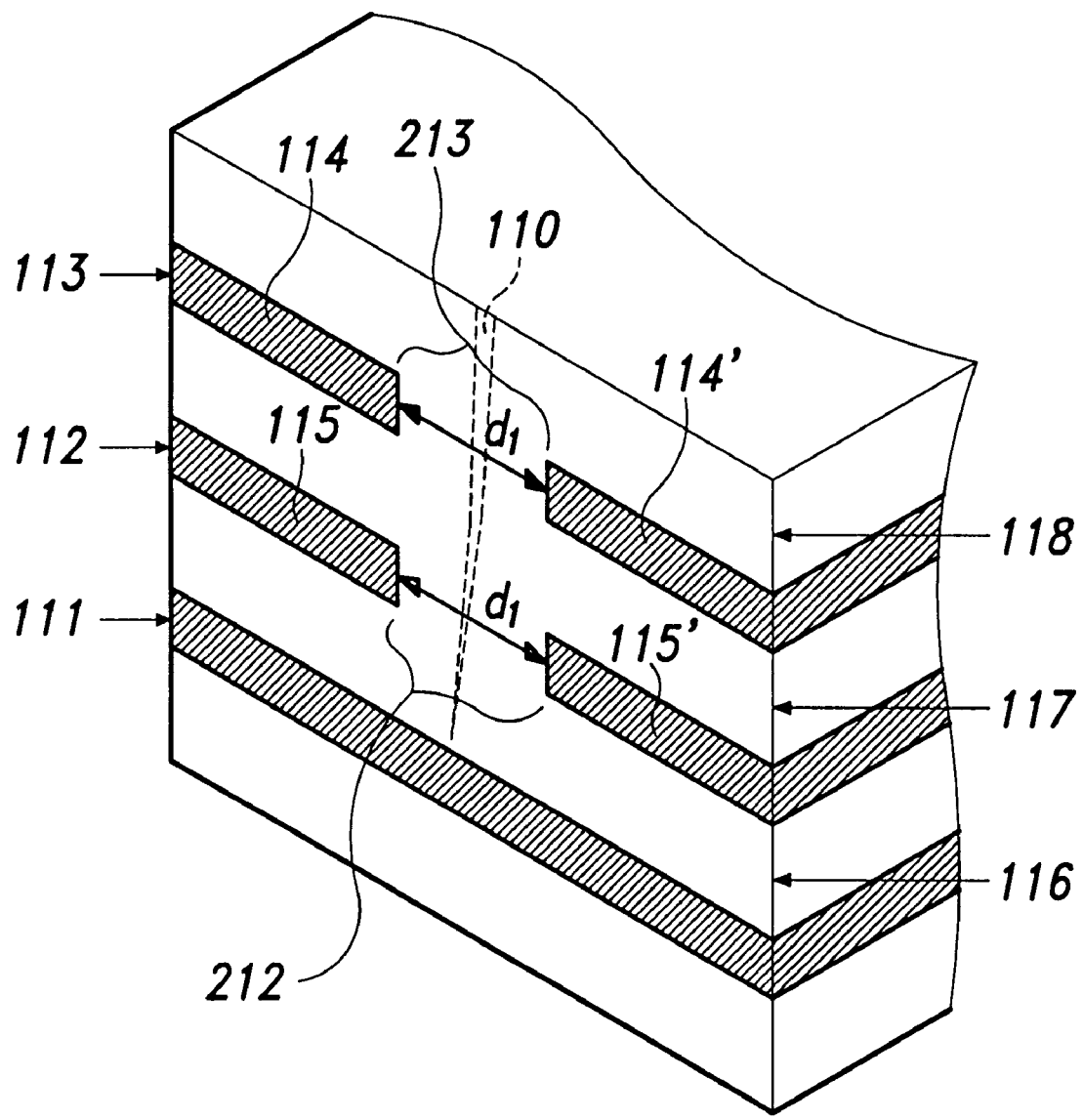
FIG. 1A is a perspective view showing a vertical crack through several insulating layers between metal layers.
Figure 2:
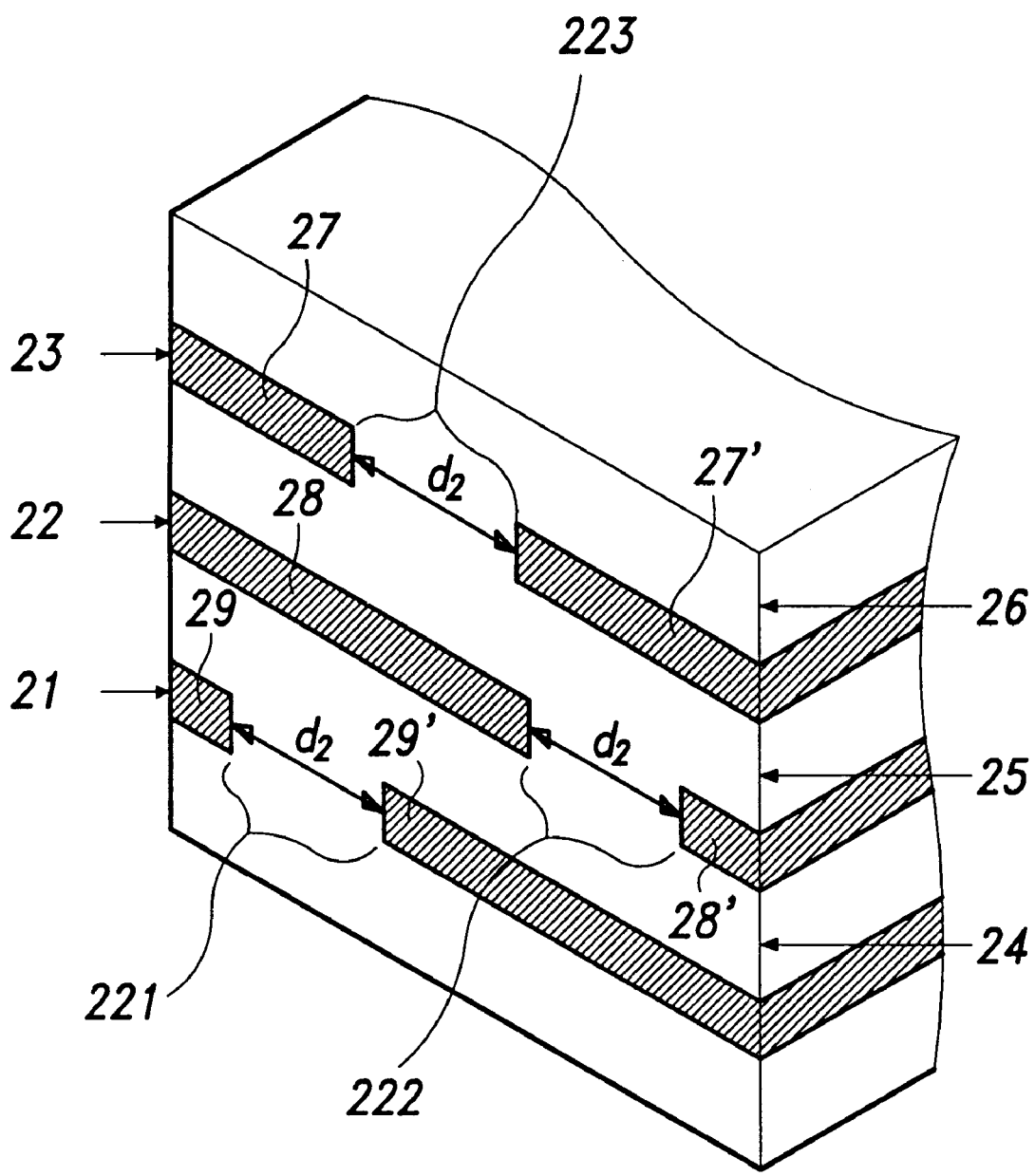
FIG. 2 and FIG. 3 show metal wiring patterns according to the present invention to avoid vertical and horizontal cracks, respectively.

FIG. 2 shows an embodiment for improving a layout of metal layer wiring patterns to avoid a vertical crack as shown for the case in FIG. 1A. In this embodiment, a first metal layer 21, a second metal layer 22, and a third metal layer 23 are successively disposed in a vertical stack with interposed insulating layers 24, 25, and 26. Metal wiring patterns 27 and 27', 28 and 28', which are formed horizontally on the respective metal layers, are disposed so that insulating spaces 222 and 223 of size d2 are positioned horizontally apart with respect to sequential metal layers 22 and 23. In other words, the insulating spaces 222, 223 in the metal layers 22, 23 are vertically shifted, i.e., all the insulating spaces in each pair of metal layers do not overlap with respect to the vertical direction. By doing so, a vertical CVD film crack, occurring due to the accumulated stresses from the added vertical thermal expansion and constriction of the metal wiring pattern compared to the CVD material stacked in the spaces 222 and 223, is avoided. In the preferred embodiment, the size d2 of the insulating space 222, 223 is about 4 µm or more. If d2 is below 4 µm the thermal expansion, between the metal wiring pattern of conventional thickness and a CVD film in a space, becomes more severe, and therefore the probability of cracking increases.

Figure 1B:
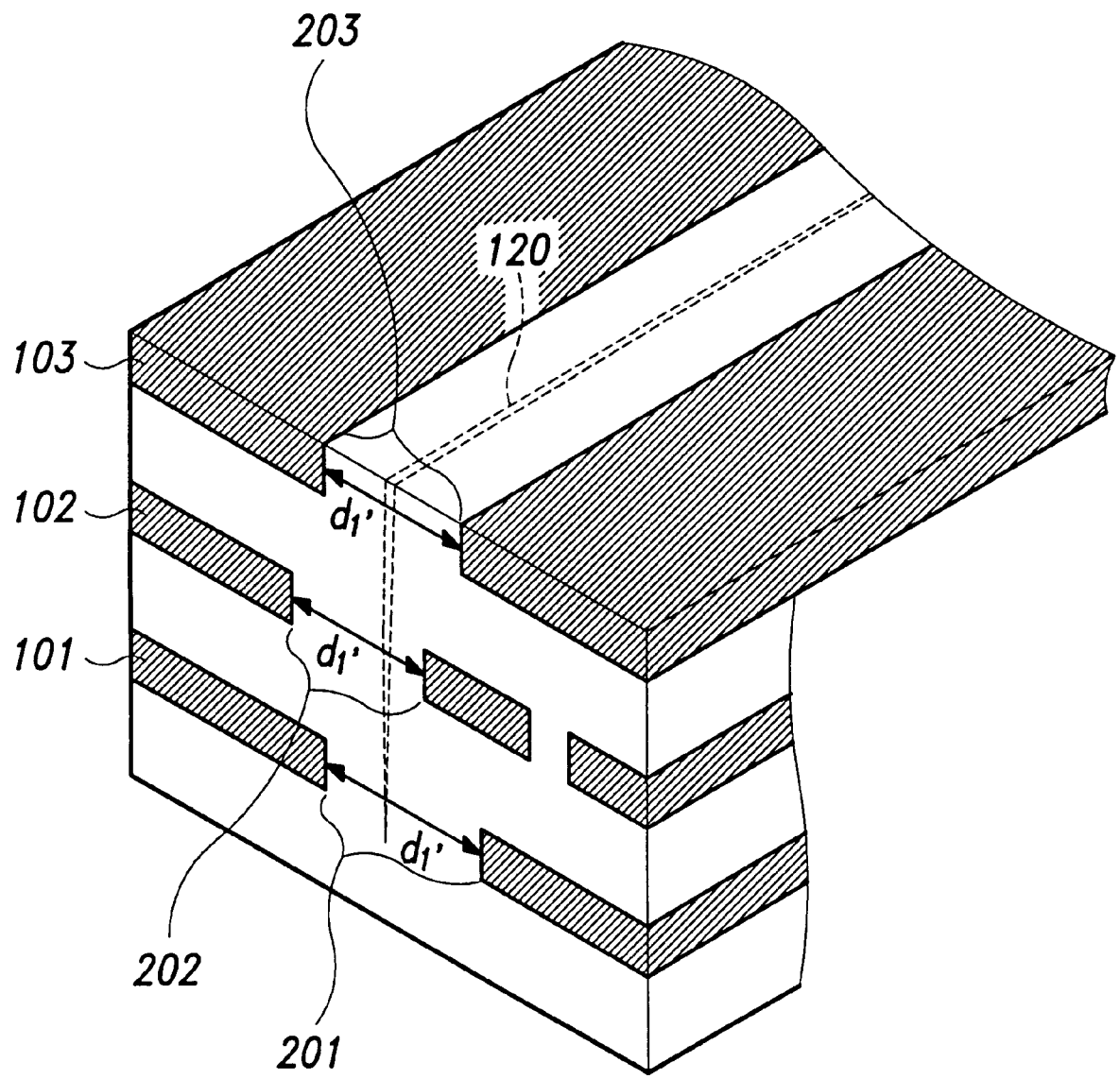
FIG. 1B is a perspective view showing a crack with a horizontal aspect between juxtaposed metal wiring patterns.
Figure 3:
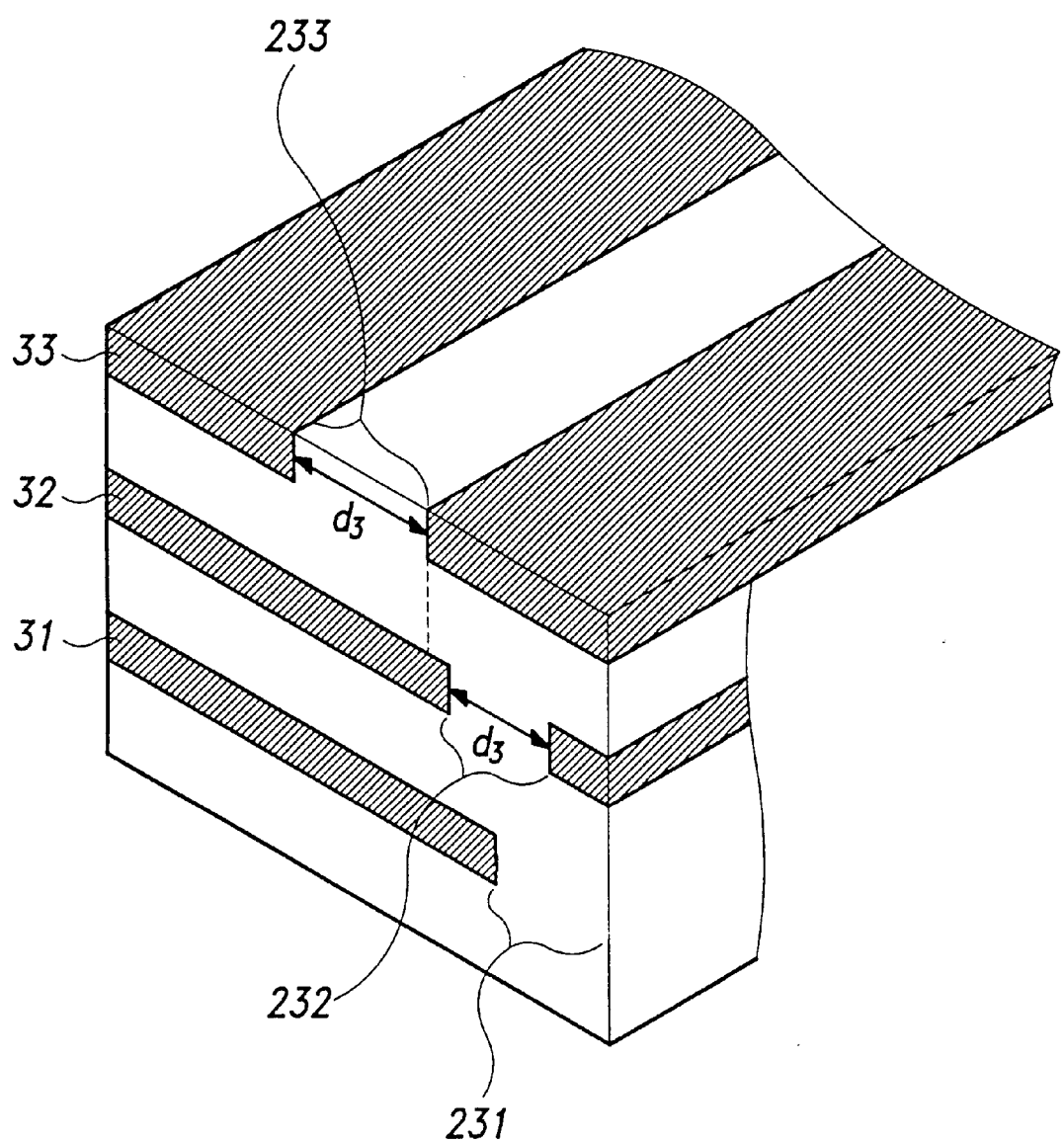

As shown in FIG. 3, metal wiring patterns are disposed to avoid a horizontal crack as shown for the case in FIG. 1B. FIG. 3 shows an embodiment in which metal layers 31, 32 and 33 are sequentially stacked with comparatively long wiring patterns juxtaposed in the same metal layer. As is shown in FIG. 3, the insulating spaces 231, 232, 233 between the juxtaposed wiring patterns of the metal layers have a size d3, and are disposed horizontally apart by alternating the positions of the insulating spaces 231, 232 and 233 with each other. In other words, the insulating spaces 231, 232, 233 in the metal layers 31, 32, 33 are vertically shifted, i.e., all the insulating spaces in each pair of metal layers do not overlap with respect to the vertical direction. In this case, it is also preferable that the distance d3 of the insulating space is about 4 µm or more. According to this embodiment, the stresses due to the metal wiring patterns are distributed, thereby preventing a CVD film from cracking.

According to the present invention, the semiconductor device defect caused by a insulating material cracking can be reduced, and thus the yield of a fabrication process can be increased. Thereby, the productivity can be increased without giving up improved semiconductor device packing density.

While this invention has been described with reference to illustrative and preferred embodiments, this description is not intended to be construed in a limiting sense. It should be understood that various modifications and alterations might be made by those of ordinary skill in the art without departing from the spirit and scope of the present invention as defined by the appended claims and their equivalents.

What is claimed is:

1. A method of preventing cracks in a semiconductor device, comprising:

successively forming at least metal layers interleaved with at least two insulating layers in a vertical direction, each metal layer including a horizontal wiring pattern;

forming insulating spaces in each wiring pattern for separating confronting edges of each wiring pattern; and arranging all insulating spaces of the wiring pattern in each of the at least three metal layers so as to be spaced apart, in a horizontal direction, from the insulating spaces in the wiring pattern of a preceding metal layer or a successive metal layer, such that none of the insulating spaces overlap in any successive vertical pair of metal layers.

2. The method of claim 1, wherein the insulating spaces and the insulating layers comprise the same material.

3. The method of claim 1, wherein the insulating spaces and the insulating layers comprise an oxide.

4. The method of claim 1, wherein, during said forming, a width of each of the insulating spaces is not less than 4 µm.

* * * * *